United States Patent [19]

Takata

[11] Patent Number: 4,962,061
[45] Date of Patent: Oct. 9, 1990

[54] METHOD FOR MANUFACTURING A MULTILAYER WIRING STRUCTURE EMPLOYING METAL FILLETS AT STEP PORTIONS

[75] Inventor: Yoshifumi Takata, Hyogo, Japan

[73] Assignee: Mitsubishi Denki Kabushiki Kaisha, Tokyo, Japan

[21] Appl. No.: 308,622

[22] Filed: Feb. 10, 1989

[30] Foreign Application Priority Data

Feb. 12, 1988 [JP] Japan .................................. 63-31200
Dec. 9, 1988 [JP] Japan ................................ 63-312666

[51] Int. Cl.⁵ ..................... H01L 21/283; H01L 21/60
[52] U.S. Cl. .................................... 437/195; 437/228; 437/245; 148/DIG. 20
[58] Field of Search ............... 437/187, 192, 195, 203, 437/228, 245, 225, 246; 357/71; 156/643; 148/DIG. 20

[56] References Cited

U.S. PATENT DOCUMENTS

| | | | |
|---|---|---|---|
| 4,507,853 | 4/1985 | McDavid | 437/187 |
| 4,666,737 | 5/1987 | Gimpelson et al. | 437/203 |
| 4,711,699 | 12/1987 | Amano | 156/643 |
| 4,807,013 | 2/1989 | Manocha | 357/71 |
| 4,849,069 | 7/1989 | Evans et al. | 156/643 |

FOREIGN PATENT DOCUMENTS

| | | | |
|---|---|---|---|
| 0204523 | 9/1987 | Japan | 437/192 |
| 0213120 | 9/1987 | Japan | 437/187 |

Primary Examiner—Olik Chaudhuri
Assistant Examiner—T. N. Quach
Attorney, Agent, or Firm—Lowe, Price, LeBlanc, Becker & Shur

[57] ABSTRACT

A method for manufacturing a semiconductor integrated circuit device having a multilayer wiring structure. A semiconductor substrate on which a scribe line portion is to be formed is prepared to form an interlayer insulating film on the semiconductor substrate. Then, the interlayer insulating film at the scribe line portion is etched away so as to expose the scribe line portion on the semiconductor substrate. At this time, a step portion of the interlayer insulating film is formed at the scribe line portion. Then, a metal wiring film is formed on the whole surface of the semiconductor substrate comprising the step portion of this interlayer insulating film and etched away such that the residue of the metal wiring film may be left so as to cover this step portion along the step portion of the interlayer insulating film. By leaving the residue of the metal wiring film thickly and long along the step portion of the interlayer insulating film in this manner, the adhesion between the residue of the metal wiring film and the semiconductor substrate becomes strong and the residue of this metal wiring film is prevented from coming off in the manufacturing steps of a semiconductor integrated circuit device and from contaminating a wafer surface or manufacturing facilities.

9 Claims, 10 Drawing Sheets

METHOD FOR MANUFACTURING A MULTILAYER WIRING STRUCTURE EMPLOYING METAL FILLETS AT STEP PORTIONS

BACKGROUND OF THE INVENTION

1. Field of the Invention

The present invention relates to a method for manufacturing a semiconductor integrated circuit device and, more particularly, to a method for manufacturing a semiconductor integrated circuit device improved to prevent the situation in which a residue of a metal wiring remains on a step portion of an interlayer insulating film and this residue comes off during manufacturing step and contaminates a wafer surface and manufacturing facilities in a scribe line portion.

2. Description of the Background Art

Figure 3:
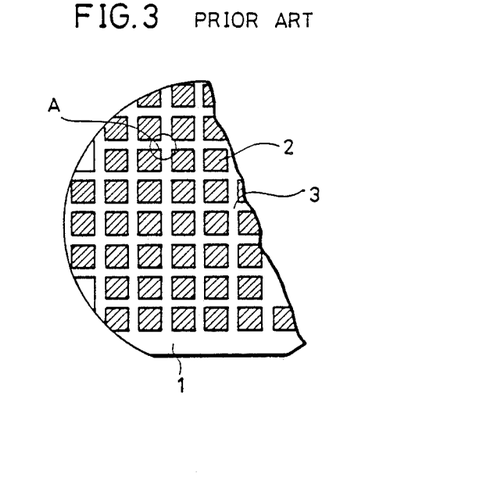
FIG. 3 is a plan view of a wafer on which a plurality of semiconductor integrated circuit devices are formed.
Figure 4:
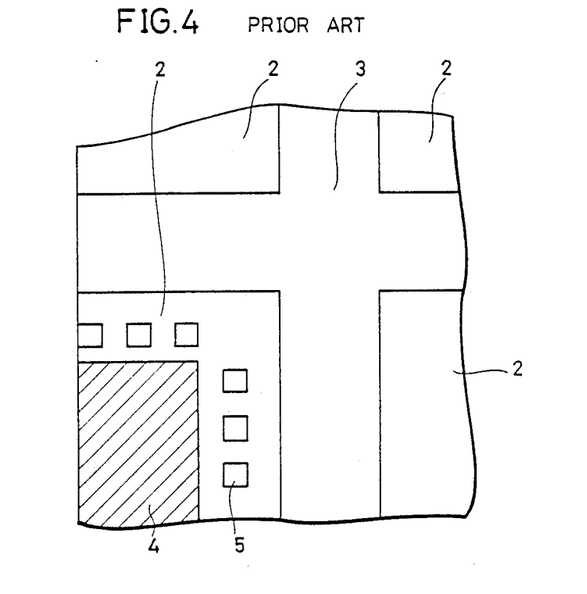
FIG. 4 is an enlarged view at an A portion in FIG. 3.

Manufacturing steps of a semiconductor integrated circuit device comprise the step of cutting a chip formed on a wafer along a scribe line. FIG. 3 is a plan view of a wafer on which a plurality of chips of a semiconductor integrated circuit are formed. Referring to FIG. 3, a plurality of chips 2 of a semiconductor integrated circuit device are formed on a wafer 1. The plurality of chips 2 are each separated by a scribe line. FIG. 4 is an enlarged view of an A portion in FIG. 3. Referring to FIG. 4, the chip 2 comprises a device forming portion 4 and a contact portion 5 with an external electrode (hereinafter referred to as a pad portion 5). Needless to say, any device, insulating film, metal wiring or the like is not provided in the portion of the scribe line 3, so that the surface of the semiconductor substrate is exposed. The chips 2 are each separated by a scriber along this scribe line 3.

Focusing on the scribe line portion, a description is given of conventional manufacturing steps of a semiconductor integrated circuit device.

FIGS. 5A to 5J are partially sectional views of a semiconductor integrated circuit device showing conventional manufacturing steps. In these figures, only a scribe line portion 3, a pad portion 5 and a device forming portion 4 are described.

Figure 5A:
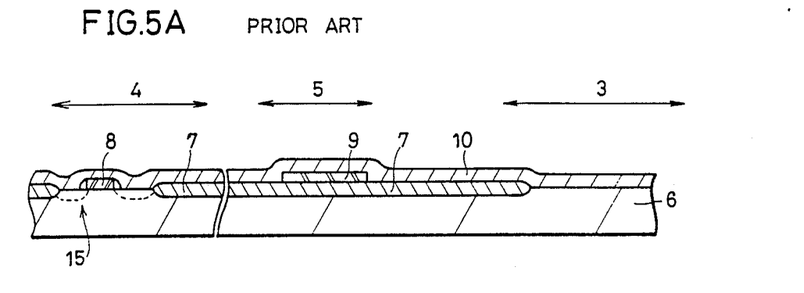
FIGS. 5A to 5J are sectional views of a conventional semiconductor integrated circuit device showing its manufacturing step.

Referring to FIG. 5A, an oxide film 7 for separating devices is formed on a main surface of a semiconductor substrate 6 on which the scribe line portion 3 is to be formed. A MOSFET comprising a device 15, for example, a gate electrode 8 is formed on an active region between the oxide films 7. Then, an external electrode 9 (hereinafter referred to as a pad 9) is formed on the oxide film 7 for separating devices. Thereafter, a first interlayer insulating film 10 is formed on the whole surface of the semiconductor substrate 6 comprising the gate electrode 8 and the pad 9.

Figure 5B:
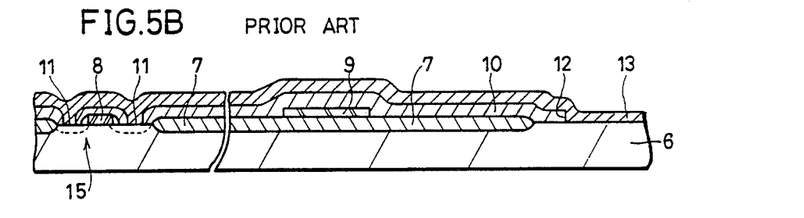

Referring to FIG. 5B, a contact hole 11 is provided in the first interlayer insulating film 10 by photolithography and etching, for example in order to expose the source and drain regions of the MOSFET. At the same time, the first interlayer insulating film 10 in the scribe line portion is etched away in order to expose the scribe line portion 3 of the semiconductor substrate 6. A step portion 12 of the first interlayer insulating film is formed in the scribe line portion 3 by etching away the first interlayer insulating film 10 in the scribe line portion 3. Then, a first metal wiring film 13 is formed on the whole surface of the semiconductor substrate 6 comprising the step portion 12 of the first interlayer insulating film and the contact hole 11.

Figure 5C:
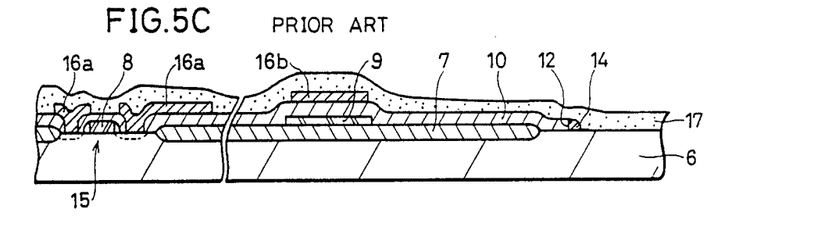

Referring to FIGS. 5B and 5C, the first metal insulating film 13 is patterned to become a given configuration to form a pattern of a first metal wiring 16a electrically connected to the source and drain regions, and a first metal wiring 16b electrically connected to the pad 9. At this time, a residue 14 of the first metal wiring film remains on the step portion 12 of the first interlayer insulating film. Then, a second interlayer insulating film 17 is formed on the whole surface of the semiconductor substrate 6 comprising the residue 14 of the first metal wiring film and the first metal wiring 16.

Figure 5D:
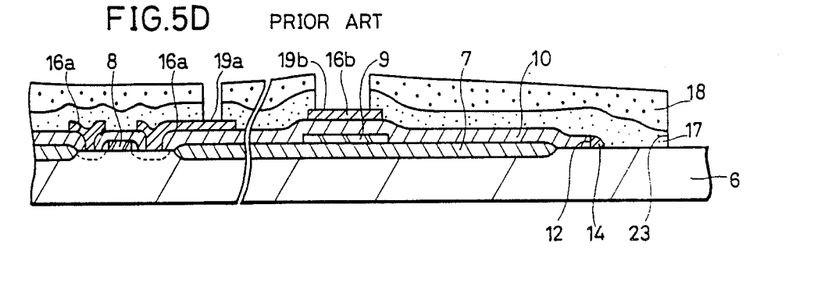

Referring to FIG. 5D, the second interlayer insulating film 17 is formed on the whole surface of the semiconductor substrate comprising the residue 14 of the first metal wiring layer and the first metal wiring 16, and a first resist 18 is applied thereto. Then, the first resist 18 is patterned by photolithography so as to form on the first resist 18 openings in a portion over the scribe line portion 3 of the semiconductor substrate 6 and portions over the contact portions of the first metal wirings 16a and 16b (the portions on which contact holes 19a and 19b are to be formed). Thereafter, the second interlayer insulating film 17 is etched to form the contact holes 19a and 19b in the second interlayer insulating film 17, using this patterned first resist 18 as a mask. At this time, a step portion 23 of the second interlayer insulating film 17 is formed in the scribe line portion 3. Then, the first resist 18 is removed.

Figure 5E:
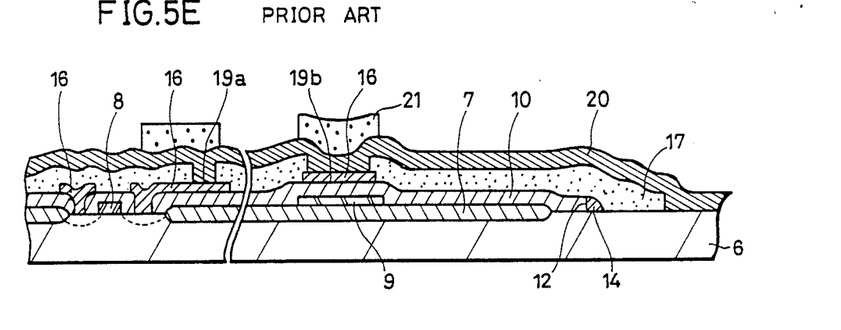

Referring to FIG. 5E, a second metal wiring film 20 is formed on the whole surface of the semiconductor substrate 6 comprising the contact holes 19a and 19b. Thereafter, a second resist 21 is applied onto the whole surface to pattern the second resist 21 such that a predetermined configuration having the upper portions of the contact holes 19a and 19b may be left.

Figure 5F:
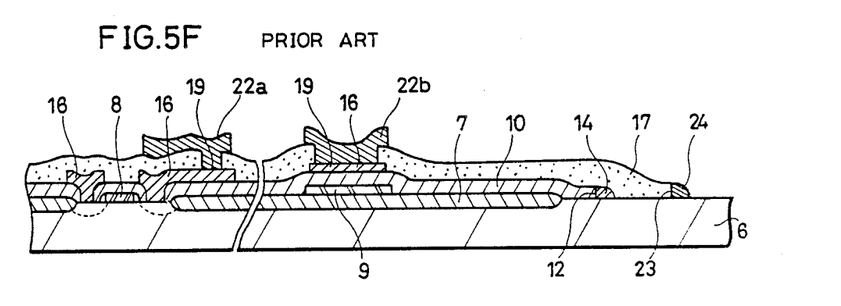

Referring to FIGS. 5E and 5F, a second metal wiring 22a electrically connected to the first metal wiring 16a for connecting to the source and drain, and a second metal wiring 22 electrically connected to the first metal wiring 16b for connecting to the pad are formed by patterning the second metal wiring film 20, using the pattern resist 21 as a mask and then removing the resist 21. When the second metal wiring film 20 is patterned, the residue 24 of the second metal wiring film is left on the step portion 23 of the second interlayer insulating film 17.

Figure 5G:
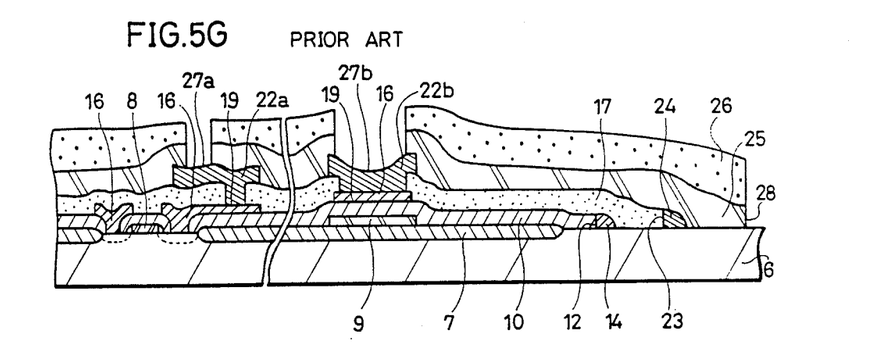

Referring to FIG. 5G, a third interlayer insulating film 25 is formed on the whole surface of the semiconductor substrate 6 comprising the residue 24 of the second metal wiring film and the second metal wirings 22a and 22b and then a third resist 26 is applied thereto. Then, the third resist 26 is patterned by photolithography so as to form openings at the portion of the scribe line portion 3 of the semiconductor substrate 6 and the portions on the second metal wirings 22a and 22b (the portion on which contact holes 27a and 27b are to be formed). Thereafter, the third interlayer insulating film 25 is etched using this patterned third resist 26 as a mask to form the contact holes 27a and 27b in the third interlayer insulating film 25. At this time, a step portion 28 of the third interlayer insulating film 25 is formed at the scribe line portion 3. Then, the third resist 26 is removed.

Figure 5H:
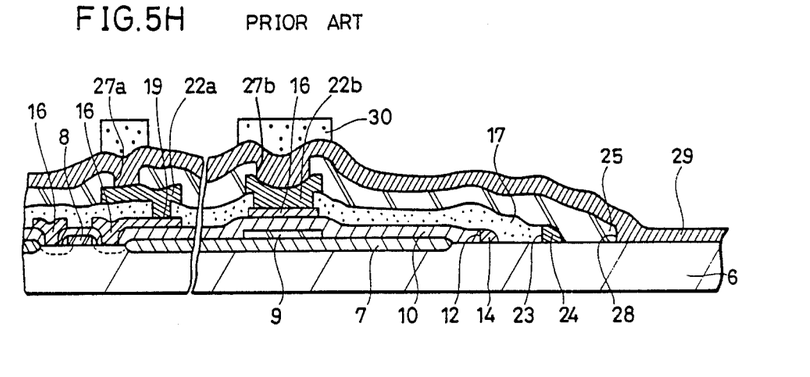

Referring to FIG. 5H, a third metal wiring film 29 is formed on the whole surface of the semiconductor substrate 6 comprising the step portion 28, the contact holes 27a and 27b. Then, a fourth resist 30 is applied to the whole surface and then patterned such that a pattern with a predetermined configuration comprising the upper portions of the contact holes 27a and 27b may be left.

Figure 5I:
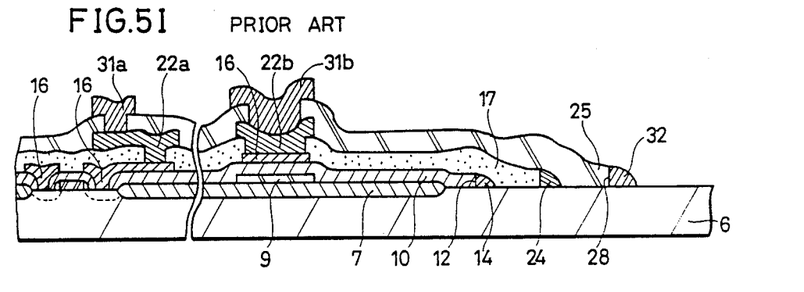

Referring to FIGS. 5H and 5I, the third metal wiring film 29 is patterned using the patterned fourth resist 30 as a mask and then the fourth resist 30 is removed to form a third metal wiring 31a electrically connected to the second metal wiring 22a and a third metal wiring 31b electrically connected to the second metal wiring 22b. When the third metal wiring film 29 is patterned, a residue 32 of the third metal wiring film is left at the step portion 28 of the third interlayer insulating film 25.

Figure 5J:
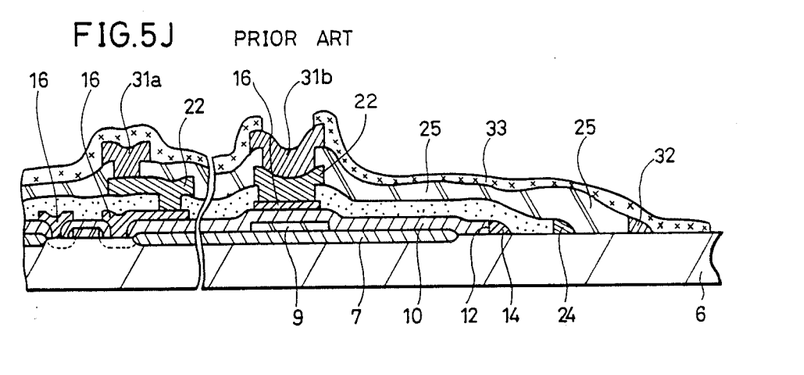

Referring to FIG. 5J, a passivation film 33 is formed on the whole surface of the semiconductor substrate 6 and etched away so as to expose the scribe line portion 3 of the semiconductor substrate 6 and the pad portion of the third metal wiring 31b, and finally the wafer shown in FIG. 3 and 4 can be formed. The chips 2 are each separated by cutting the scribe line portion 3 with a scriber.

A method for manufacturing a conventional semiconductor integrated circuit device is structured as described above. Referring to FIGS. 5B, 5E and 5H, the first metal wiring film 13, the second metal wiring film 20 and the third metal wiring film 29 are usually formed by sputtering and the like. However, as devices are miniaturized, it is required that the step coverage of the metal wiring films 13, 20 and 29 should be improved. Therefore, as means for forming a metal wiring film, a method by bias sputtering, a method for preheating the semiconductor substrate 6 at the time of sputtering and a method by CVD are proposed at present to improve the step coverage. On the other hand, many cases use anisotropic etching such as reactive ion etching which is superior in processing controllability in etching the metal wiring films 13, 20 and 29. This reactive ion etching is a technique developed to meet the demand of the miniaturization of devices and it is indispensable means in manufacturing the present semiconductor integrated circuit device.

However, the following problem is raised when the metal wiring films 13, 20 and 29 having good step coverage is processed by anisotropic etching such as reactive ion etching which is superior in processing controllability to expose the surface of the semiconductor substrate 6 in the scribe line portion 3. That is, a film thickness of the metal wiring film 13 in the step portion 12 of the interlayer insulating film 10 is thicker than the plain portion of the scribe line portion 3 by a film thickness of the lower layer interlayer insulting film 10. For this reason, referring to FIG. 5C, when anisotropic etching method is used to selectively etch the metal wiring film 13 away, the undesirable residue 14 of the metal wiring film substantially remains at the step portion 12 of the interlayer insulating film 10. The higher and steeper the step portion of the interlayer insulating film of the lower layer is and the better the step coverage of the metal wiring film is and, further, the stronger the anisotropy of the anisotropic etching is, the more conspicuous the residue 14 of the metal wiring film at the time of etching is. Such a defect can be reduced by making thin and plain the interlayer insulating film of the lower layer to control the step portion of the interlayer insulating film of the lower layer. However, even if the interlayer insulating film of the lower layer was made thin and plain, it was not possible to perfectly prevent the metal wiring film from being left at the step portion of the interlayer insulating film in the scribe line portion 3 as long as anisotropic etching means was used. Since these residues 14, 24 and 32 of the metal wiring films remained thinly and long along the interlayer insulating films 10, 20 and 25, respectively, as shown in FIG. 5J, the adhesion with the semiconductor substrate 6 was relatively weak and the residue of the metal wiring film came off the step portion during the manufacturing step to contaminate a wafer surface or manufacturing facilities, causing a pattern defect in the semiconductor integrated circuit device.

As means for removing the residue of the metal wiring film, there is proposed a method for removing the residue of the metal wiring film completely by performing the anisotropic etching for more than usual time or a method for removing the residue of the metal wiring film by adding isotropic etching to this anisotropic etching. However, in the case of the former method, it is necessary to add a considerable long etching time, causing damage to the interlayer insulating film of the lower layer. In addition, it is necessary to make thick the resist used as a mask at the time of etching, causing another problem such as the reduction of the throughput. In case of the latter method, as a device is miniaturized, there are many disadvantages that the processing precision and control ability are lowered and a width of the metal wiring is reduced and the like.

SUMMARY OF THE INVENTION

An object of the present invention is to provide a method for manufacturing a semiconductor integrated circuit device by which a residue of a metal wiring film does not easily come off a step portion of an interlayer insulating film.

Another object of the present invention is to provide a method for manufacturing a semiconductor integrated circuit device by which a wafer surface or manufacturing facilities are not contaminated.

The method for manufacturing a semiconductor integrated circuit device in accordance with the present invention comprises the steps of preparing a semiconductor substrate on which a scribe line portion is to be formed; forming a first interlayer insulating film on the semiconductor substrate wherein the first layer has an exposed surface; etching away the first interlayer insulating film on the scribe line portion so as to expose the scribe line portion of said semiconductor substrate; a step portion comprising an edge of the fist interlayer insulating film being formed at the scribe line portion by etching the first interlayer insulating film; forming a first metal wiring layer on the whole surface of the semiconductor substrate comprising said exposed surface and the step portion of the first interlayer insulating film after etching the first interlayer insulating film; etching the first metal wiring film away; and the etching of the first metal wiring film being performed such that a portion or residue of the metal wiring film may be left so as to cover the edge and an adjoining portion of the exposed surface along the step portion of the first interlayer insulating film in the scribe line portion.

In a preferred embodiment, a method comprises the steps of forming a second interlayer insulating film on the whole surface of the semiconductor substrate comprising the residue of the first metal wiring film, after etching the first metal wiring film, wherein the second interlayer has an exposed surface; etching the second interlayer insulating film at the scribe line portion so as to expose the scribe line portion of the semiconductor substrate; the step portion comprising an edge of the second interlayer insulating film being formed in the scribe line portion by etching the second interlayer insulating film; forming a second metal wiring film on the whole surface of the semiconductor substrate comprising the exposed surface and the step portion of the second interlayer insulating film after etching the second interlayer insulating film; etching the second metal wiring film; and the etching process of the second metal wiring film being performed such that the residue of the second metal wiring film may remain so as not to intersect or overlap with the residue of the first metal wiring film and so as to cover the edge and an adjoined of the exposed surface of the second interlayer insulating film along this step portion.

According to the present invention, since the etching process of the first metal wiring film is performed such that the residue of the first metal wiring film may remain to cover the step portion of the first interlayer insulating film along this step portion in the scribe line portion, the adhesion between the residue of the metal wiring film and the semiconductor substrate becomes strong. Therefore, it is possible to prevent the residue from coming off the step portion and contaminating a wafer surface or manufacturing facilities.

As described above, if the residue of the second metal wiring film is left so as not to intersect or overlap with the residue of the first metal wiring film, the height of the step of the scribe line end portion can be reduced as low as possible.

The foregoing and other objects, features, aspects and advantages of the present invention will become more apparent from the following detailed description of the present invention when taken in conjunction with the accompanying drawings.

DESCRIPTION OF THE PREFERRED EMBODIMENTS

Referring to figures, a description is given of one embodiment of the present invention.

FIGS. 2A to 2J are sectional views of a semiconductor integrated circuit device showing its manufacturing steps in accordance with the present invention. In these figures, only a device forming portion 4, a pad portion 5 and a scribe line portion 3 are shown.

Figure 2A:
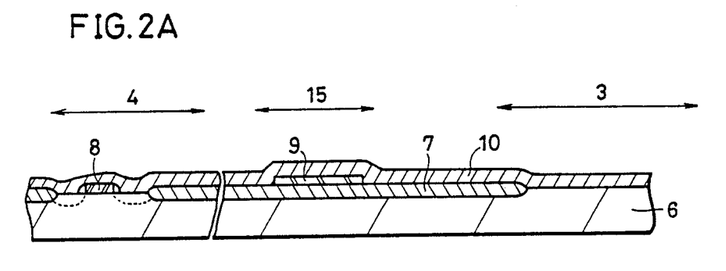
FIGS. 2A to 2J are sectional views of a semiconductor integrated circuit device showing its manufacturing steps in accordance with another embodiment of the present invention.

Referring to FIG. 2A, a semiconductor substrate 6 (for example silicon substrate) on which the scribe line portion 3 is to be formed is prepared. An oxide film 7 for separating devices is formed on the main surface of the semiconductor substrate 6 to form a device, for example MOSFET in the active region between the oxide films 7. The MOSFET comprises a gate electrode 8. Then, a pad 9 is formed on the oxide film 7. Thereafter, a first interlayer insulating film 10 is formed on the whole surface of the semiconductor substrate 6 comprising the gate electrode 8 and the pad 9.

Figure 2B:
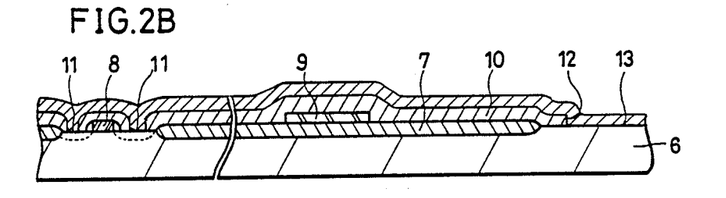

Referring to FIG. 2B, a contact hole 11 is formed in the first interlayer insulating film 10 by photolithography and etching in order to expose a contact portion of the source and drain regions of the MOSFET. At the same time, the first interlayer insulating film 10 in the scribe line portion 3 is etched away in order to expose the scribe line portion 3 of the semiconductor substrate 6. A step portion 12 of the first interlayer insulating film 10 is formed on the scribe line portion 3 by etching the first interlayer insulating film 10 in this scribe line portion 3. Then, a first metal wiring film 13 is formed on the whole surface of the semiconductor substrate 6 comprising the step portion 12 of the first interlayer insulating film and the contact hole 11.

Figure 2C:
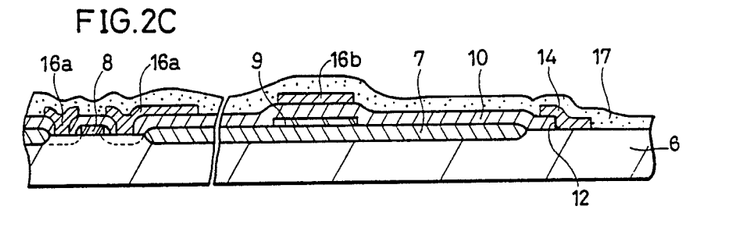

Referring to FIG. 2C, the first metal wiring film 13 is patterned by photolithography and etching, for example anisotropic etching such as reactive ion etching to form a first metal wiring 16a electrically connected to the source and drain electrodes and a first metal wiring 16b electrically connected to the pad 9. At the same time, the patterning of the first metal wiring film 13 is performed such that the residue 14 of the first metal wiring film 10 may be left so as to cover the step portion 12 of the first interlayer insulating film 10 along this step portion 12 in the scribe line portion 3. The adhesion between the semiconductor substrate 6 and the residue 14 becomes strong leaving the residue 14 thickly and long along the step portion 12. Therefore, the residue is prevented from coming off the step portion 12 and contaminating a wafer surface and manufacturing facilities as conventional. Then, a second interlayer insulating film 17 is formed on the whole surface of the semiconductor substrate 6 comprising the residue 14 of the first metal wiring film and the metal wirings 16a and 16b.

Figure 2D:
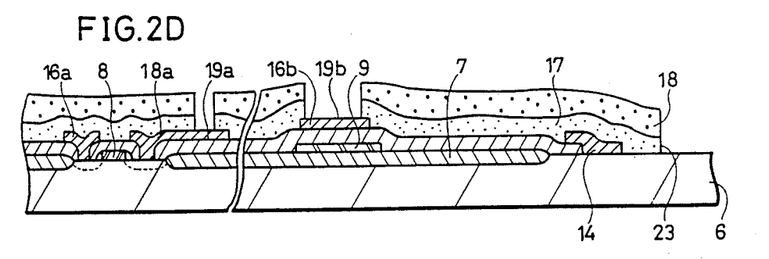

Referring to FIG. 2D, a first resist 18 is applied onto the second interlayer insulating film 17. Then, the first resist 18 is patterned by photolithography so as to form openings over the portion over the scribe line portion 3 of the semiconductor substrate 6 and at the portions over the contact portions of the first metal wirings 16a and 16b. Thereafter, the second interlayer insulating film 17 is etched using this patterned first resist 18 as a mask. Through this etching process, contact holes 19a and 19b are formed in the second interlayer insulating film 17, while a step portion 23 of the second interlayer insulating 17 is formed at the scribe line portion. Then, the first resist 18 is removed.

Figure 2E:
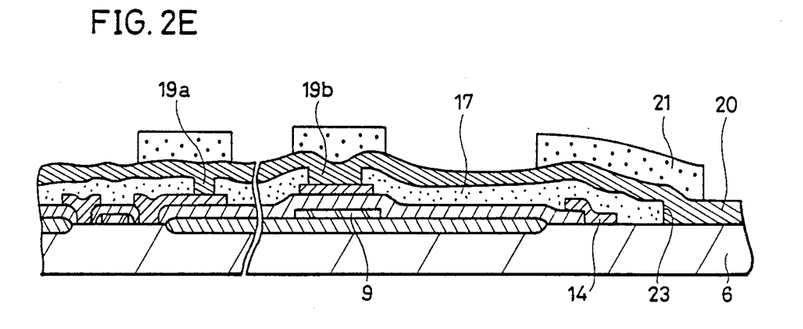

Referring to FIG. 2E, a second metal wiring film 20 is formed on the whole surface of the semiconductor substrate comprising the contact holes 19a and 19b and the step portion 23. Then, a second resist 21 is applied onto the whole surface of the semiconductor substrate 6. Thereafter, the second resist 21 is patterned by photolithography such that the portions over the contact holes 19a and 19b and the portions over predetermined regions comprising the residue 14 of the first metal wiring film and the step portion 23 of the second interlayer insulating film may be left.

Figure 2F:
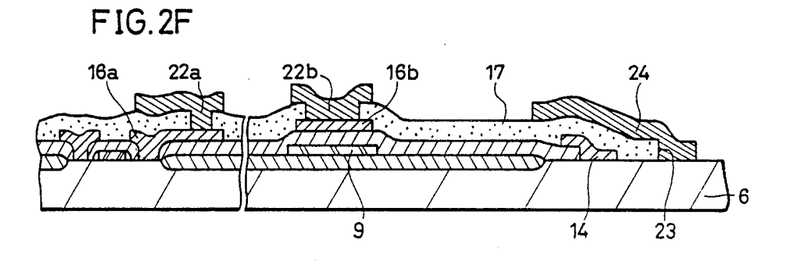

Referring to FIGS. 2E and 2F, the second metal wiring film 20 is patterned using the thus patterned second resist 21 as a mask and the second resist 21 is removed to form a second metal wiring 22a electrically connected to the first metal wiring 16a for connecting to the source and drain and a second metal wiring 22b electrically connected to the first metal wiring 16b for connecting to the pad. On the other hand, the residue 24 of the second metal wiring film is left so as to cover the step portion 23 of the second interlayer insulating film along the step portion 23 in the scribe line portion 3. The residue 24 of the second metal wiring film is left widely so as to overlap with the residue 14 of the first metal wiring film. By leaving the residue 24 of the second metal wiring film widely and long along the step portion 23 of the second interlayer insulating film in this way, the adhesion between the semiconductor substrate 6 and the residue 24 of the second metal wiring film becomes strong, so that the residue 24 of the second metal wiring film will not come off the step portion 23 of the second interlayer insulating film.

Figure 2G:
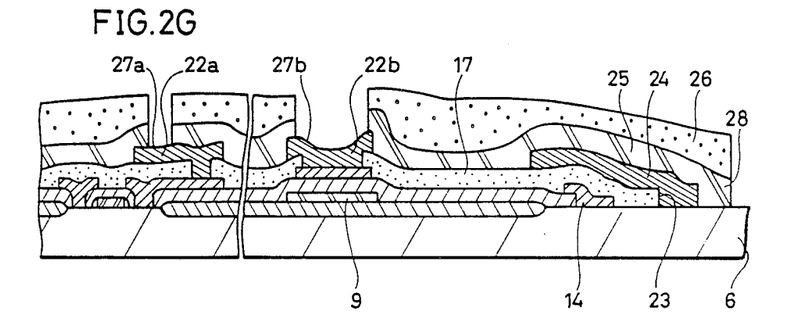

Referring to FIG. 2G, a third interlayer insulating film 25 is formed on the whole surface of the semiconductor substrate 6 comprising the residue 24 of the second metal wiring film, the second metal wiring 22a for connecting to the source and drain and the second metal wiring 22b for connecting to the pad, and then a third resist 26 is formed thereon. Then, the third resist 26 is patterned by photolithography so as to form openings at the portion over the scribe line portion 3 of the semiconductor substrate 6, the portion over the contact portion of the second metal wiring 22a for connecting to the source and drain (the portion on which a contact hole 27a is to be formed) and the portion over the contact portion of the second metal wiring 22b for connecting to the pad (the portion on which a contact hole 27b is to be formed). Thereafter, the third interlayer insulating film 25 is etched away using this patterned third resist 26 as a mask to form the contact holes 27a and 27b in the third interlayer insulating film 25. At this time, a step portion 28 of the third interlayer insulating film 25 is formed at the scribe line portion 3. Then, the third resist 26 is removed.

Figure 2H:
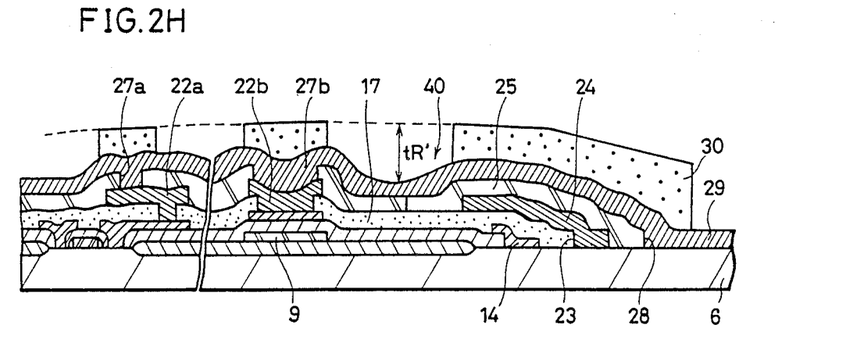

Referring to FIG. 2H, a third metal wiring film 29 is formed on the whole surface of the semiconductor substrate 6 comprising the step portion 28 of the third interlayer insulating film and the contact holes 27a and 27b. Then, a fourth resist 30 is applied on the whole surface and then patterned by photolithography so as to leave the portions over the contact holes 27a and 27b and the portion over predetermined regions comprising the residue 14 of the first metal wiring film, the residue 24 of the second metal wiring film and the step portion 28 of the third interlayer insulating film.

Figure 2I:
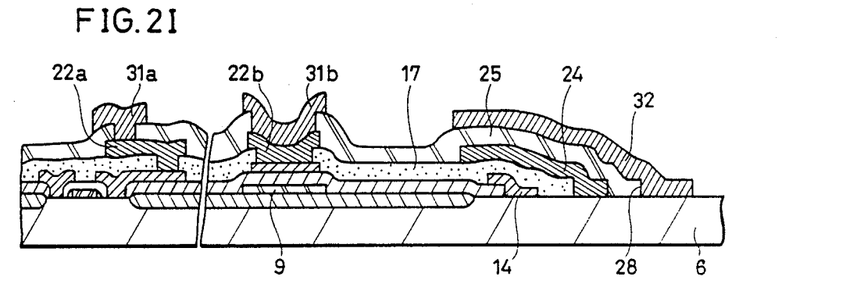

Referring to FIGS. 2H and 2I, the third metal wiring film 29 is patterned using the thus patterned fourth resist 30 as a mask and then the fourth resist 30 is removed. Then, there is formed a third metal wiring 31a electrically connected to the second metal wiring 22a for connecting to the source and drain and a third metal wiring 31b electrically connected to the second metal wiring 22b for connecting to the pad. On the other hand, the residue 32 of the third metal wiring film is left so as to cover the step portion 28 of the interlayer insulating film along this step portion 28 at the scribe line portion 3. Then, the residue 32 of the third metal wiring film is left widely so as to overlap with the residue 24 of the second metal wiring film. In this way, by leaving the residue 32 of the third metal wiring film thickly and long along the step portion 28 of the third interlayer insulating film, the adhesion between the semiconductor substrate 6 and the residue 32 of the metal wiring film becomes strong, so that the residue 32 of the third metal wiring film will not come off the step portion 28 of the third interlayer insulating film.

Figure 2J:
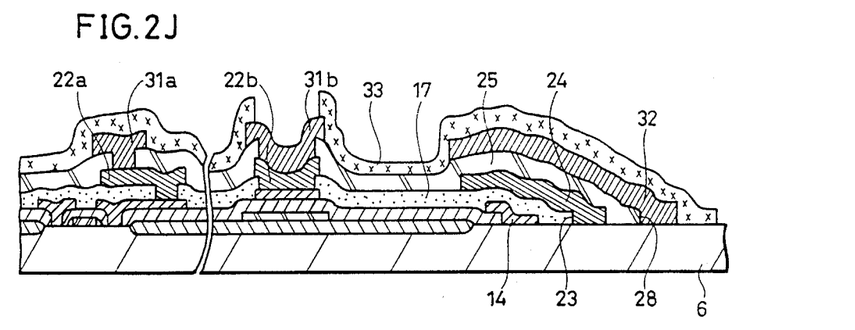

Referring to FIG. 2J, a passivation film 33 is formed on the whole surface of the semiconductor substrate 6 and etched so as to expose the scribe line portion 3 of the semiconductor substrate 6 and the contact portion of the third metal wiring 31b for connecting to the pad. Then, finally the wafer as shown in FIG. 3 and 4 can be obtained.

FIGS. 1A to 1J are sectional views of a semiconductor integrated circuit device showing its manufacturing steps in accordance with another embodiment of the present invention improving on the first embodiment shown in FIGS. 2A to 2J. In the first embodiment, since the residues 14, 24 and 32 of the metal wiring films are left thickly and so long as to cover the step portions 10, 12, 23 and 28 of the interlayer insulating films 10, 17 and 25, respectively, along this step portions in the scribe line portion 3, the residues of these metal wiring films are prevented from coming off the step portions of the interlayer insulating films. However, referring to FIG. 2H, since the residue 14 of the first metal wiring film, the residue 24 of the second metal wiring film and the residue 29 of the third metal wiring film are overlapped with each other vertically, the step at the end portion of the scribe line portion 3 is high and steep. Therefore, a recessed portion 40 between the scribe line portion 3 and the pad portion 5 is formed. As a result, when photolithography is used, a film thickness (tR') of the fourth resist 30 at the recessed portion 40 becomes thick, causing a resolution failure of the fourth resist at the recessed portion 40, with the result that the etching process cannot be reliably performed. The second embodiment shown in FIGS. 1A to 1J comprises an improvement on this respect.

Figure 1A:
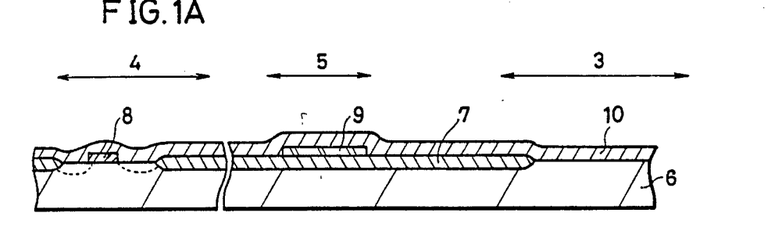
FIGS. 1A to 1J are sectional views of a semiconductor integrated circuit device showing its manufacturing steps in accordance with one embodiment of the present invention.

Although a scribe line portion 3, a pad portion 5 and a device forming portion 4 are shown in FIG. 1A, they are not shown for the sake of clarity in FIGS. 1B to 1G.

Referring to FIG. 1A, the semiconductor substrate 6 on which a scribe line portion 3 is to be determined is prepared. An oxide film 7 for separating devices is formed on the main surface of the semiconductor substrate. A device, for example, MOSFET is formed at an active region between the oxide films 7. The MOSFET comprises a gate electrode 8. Then, a pad 9 is formed on the oxide film 7. Then, a first interlayer insulating film 10 is formed on the whole surface of the semiconductor substrate 6 comprising the gate electrode 8 and the pad 9.

Figure 1B:
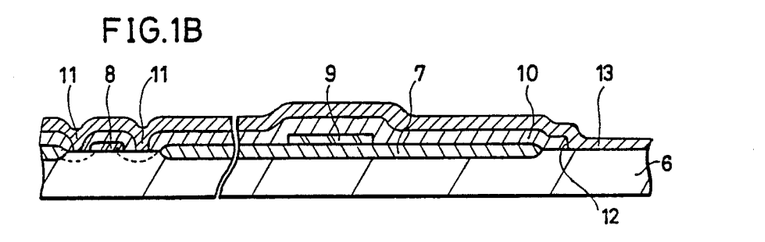

Referring to FIG. 1B, a contact hole 11 is provided in the first interlayer insulating film 10 by photolithography and etching in order to expose a contact portion of the source and drain regions of the MOSFET. At the same time, the first interlayer insulating film 10 in the scribe line portion 3 is etched away in order to expose the scribe line portion 3 of the semiconductor substrate 6. By etching away the first interlayer insulating film 10 at this scribe line portion 3, a step portion 12 of the first interlayer insulating film is formed at the scribe line portion 3.

Then, a first metal wiring film 13 is formed on the whole surface of the semiconductor substrate 6 comprising the contact hole 11a and the step portion 12 of the first interlayer insulating film.

Figure 1C:
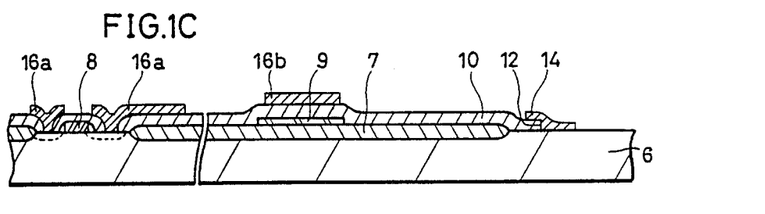

Referring to FIG. 1C, the first metal wiring film 13 is patterned by photolithography and etching to form a first metal wiring 16a electrically connected to the source and drain electrode and a first metal wiring 16b electrically connected to the pad 9. On the other hand, the patterning process of the first metal wiring film 13 is performed such that the residue 14 of the first metal wiring film may be left to cover the step portion 12 of the first interlayer insulating film along this step portion of the first interlayer insulating film 10 in the scribe line portion 3. By leaving the residue 14 of the first metal wiring film thickly and long along the step portion 12 of the first interlayer insulating film in this way, the adhesion between the semiconductor substrate 6 and the residue 14 of the first metal wiring film becomes strong. Therefore, the residue of the metal wiring film is prevented from coming off the step portion of the interlayer insulating film and contaminating the whole surface or manufacturing facilities.

Figure 1D:
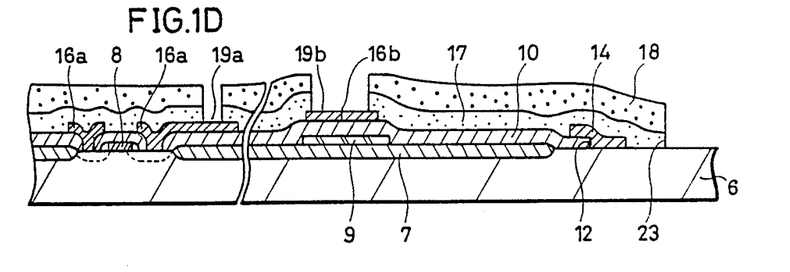

Referring to FIG. 1D, a second interlayer insulating film 17 is formed on the whole surface of the semiconductor substrate 6 comprising the residue 14 of the first metal wiring film, the first metal wiring 16a for connecting to the source and drain and the first metal wiring 16b for connecting to the pad, and then a first resist 18 is applied thereto. Then, the first resist 18 is patterned by photolithography so as to form openings at the portion over the scribe line portion 3 of the semiconductor substrate 6 and the portion over the contact portions of the first metal wiring 16a for connecting to the source and drain and the first metal wiring 16b for connecting to the pad. Then, the second interlayer insulating film 17 is etched away using this patterned first resist 18 as a mask to form contact holes 19a and 19b on the second interlayer insulating film. At this time, a step portion 23 of the second interlayer insulating film 17 is formed at the scribe line portion 3. Thereafter, the first resist 18 is removed.

Figure 1E:
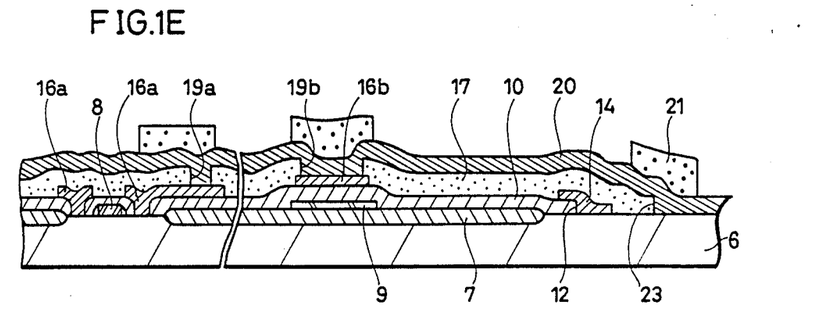

Referring to FIG. 1E, a second metal wiring film 20 is formed on the whole surface of the semiconductor substrate 6 comprising the contact holes 19a and 19b and then a second metal wiring film 20 is formed on the whole surface thereof. Thereafter, the second resist 21 is patterned by photolithography such that the second resist 21 may be left in predetermined positions over the contact holes 19a and 19b and it may be left so as to cover the step portion 23 of the second interlayer insulating film along this step portion in the scribe line portion 3, and the second resist 21 in the scribe line portion 3 to be left by patterning may not intersect nor overlap with the residue 14 of the first metal wiring film.

Figure 1F:
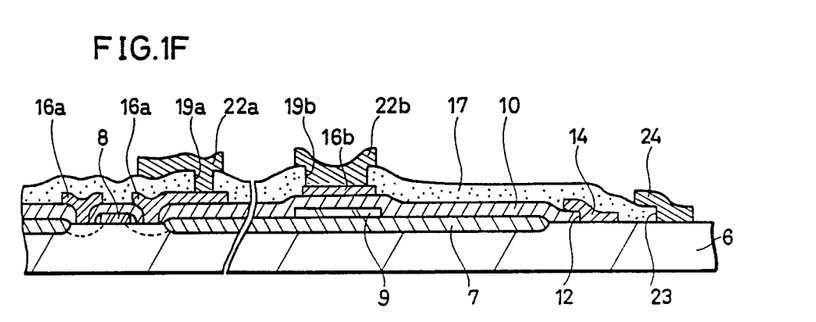

Referring to FIG. 1F, the second metal wiring film 20 is patterned using the thus patterned second resist 20 as a mask and then the second resist 21 is removed to form a second metal wiring 22a electrically connected to the first metal wiring 16a for connecting to the source and drain and a second metal wiring 22b electrically connected to the first metal wiring 16b for connecting the pad. On the other hand, the residue 24 of the second metal wiring film is left so as to cover the step portion 23 of the second interlayer insulating film along this step portion and so as not to overlap with the residue 14 of the first metal wiring film in the scribe line portion 3.

By leaving the residue of the second metal wiring film thickly and long along the step portion 23 of the second interlayer insulating film in this manner, the adhesion between the semiconductor substrate and the residue 24 of the second metal wiring film becomes strong and the residue 24 of the second metal wiring film is prevented from coming off the step portion 23 of the second interlayer insulating film. In addition, since the residue 24 of the second metal wiring film is left so as not to overlap with the residue 14 of the first metal wiring film vertically, the configuration of the step portion is very gently-sloping at the end portion of the scribe line portion 3.

Figure 1G:
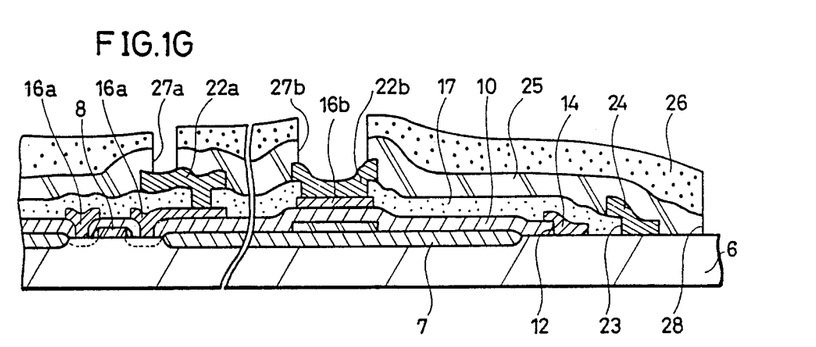

Referring to FIG. 1G, a third interlayer insulating film 25 is formed on the whole surface of the semiconductor substrate 6 comprising the residue 24 of the second metal wiring film, the second metal wiring 20a for connecting to the source and drain and the second metal wiring 22b for connecting to the pad, and then a third resist 26 is formed thereon. Then, the third resist 26 is patterned by photolithography so as to form openings at the portion over the scribe line portion 3 of the semiconductor substrate 6 and the portion over the contact portions of the second metal wiring 22a for connecting to the source and drain and the second metal wiring 22b for connecting to the pad. Thereafter, the third interlayer insulating film 25 is etched away using this patterned third resist 26 as a mask to form contact holes 27a and 27b on the third interlayer insulating film 25. At this time, a step portion 28 of the third interlayer insulating film 25 is formed at the scribe line portion 3. Then, the third resist 26 is removed.

Figure 1H:
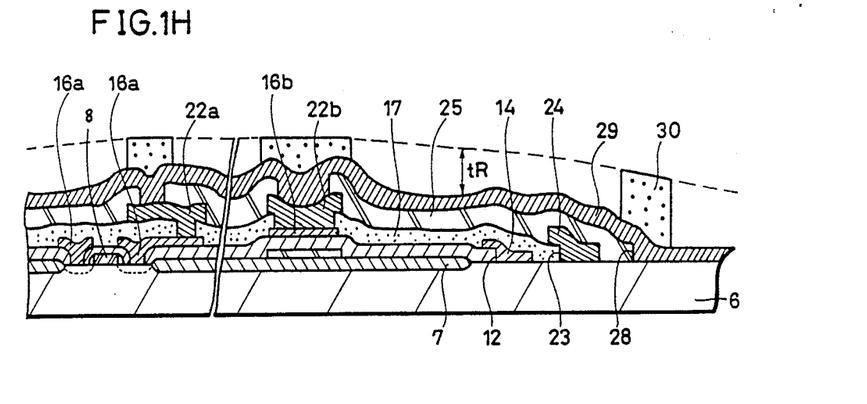

Referring to FIG. 1H, a third metal wiring film 29 is formed on the whole surface of the semiconductor substrate 6 comprising the step portion 28 of the third interlayer insulating film and the contact holes 27a and 27b, and then a fourth resist 30 is applied thereto. Thereafter, the fourth resist 30 is patterned by photolithography such that it maybe left in the predetermined positions over the contact holes 19a and 19b and may be left so as to cover the step portion 28 of the third interlayer insulating film along this step portion in the scribe line portion 3 and such that the fourth resist 30 in the scribe line portion 3 to be left by patterning may not intersect nor overlap with the residue 14 of the first metal wiring film and the residue 24 of the second metal wiring film.

In FIG 1H, since the residue 14 of the first metal wiring film and the residue 24 of the second metal wiring film are not overlapped vertically, the step portion at the scribe line portion 3 is reduced as low as possible. Therefore, a recessed portion as shown in FIG. 2H is not formed at the portion between the scribe line portion 3 and the pad portion 5. As a result, since a film thickness ($t_R$) of the fourth resist at the portion between the scribe line portion 3 and the pad portion 5 is not thick, the resolution of the fourth resist 30 at this portion becomes good and the etching precision at this portion becomes very accurate.

Figure 1I:
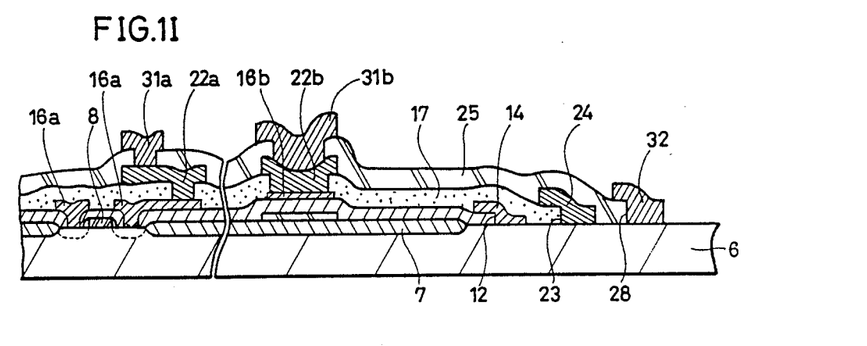

Referring to FIGS. 1H and 1I, the third metal wiring film 29 is patterned using this patterned fourth resist 30 as a mask and then the fourth resist 30 is removed to form a third metal wiring 31a electrically connected to the second metal wiring 22a for connecting to the source and drain and a third metal wiring 31b electrically connected to the second metal wiring 22b for connecting to the pad. On the other hand, the residue 32 of the third metal wiring film is left so as to cover the step portion 28 of the third interlayer insulating film along this step portion and so as not to overlap with the residue 24 of the metal wiring film in the scribe line portion 3. By leaving the residue 32 of the third metal wiring film thickly and long along the step portion 28 of the third interlayer insulating film in this manner, the adhesion between the semiconductor substrate 6 and the residue 32 of the third metal wiring film becomes strong and the residue 32 of the third metal wiring film is prevented from coming off the step portion 28 of the third interlayer insulating film. In addition, since the residue 32 of the third metal wiring film is made not to overlap with the residue 24 of the second metal wiring film vertically, the reconfiguration of the step of the end portion of the scribe line portion 3 is very gently-sloping.

Figure 1J:
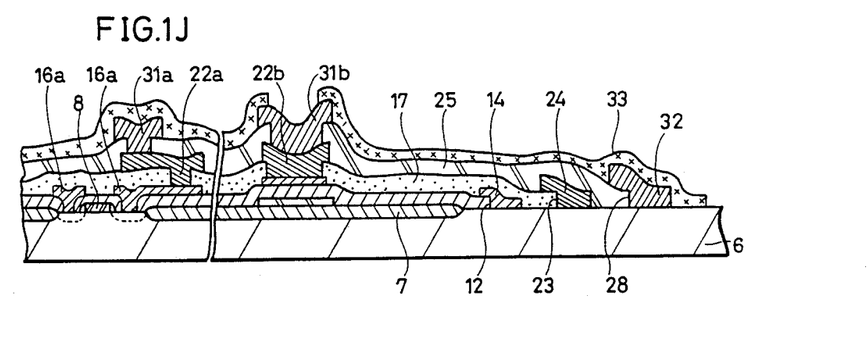

Referring to FIG. 1J, a passivation film 33 is formed on the whole surface of the semiconductor substrate 6 and then etched away so as to expose the scribe line portion 3 of the semiconductor substrate 6 and the contact portion of the third metal wiring 31 for connecting to the pad. Thus, a wafer 1 as shown in FIGS. 5 and 6 can be finally obtained. By cutting the scribe line portion 3 with a scriber, the chips 2 are each separated.

Although the present invention was applied to a method for manufacturing a semiconductor integrated circuit device of a three-layer wiring structure in the above described embodiment, the present invention is not limited to this and the same effect can be implemented even if the present invention is applied to a semiconductor integrated circuit device of a two-layer wiring structure or four-layer or more wiring structure.

In addition, although the residue of the second metal wiring film was left so as not to overlap with the residue of the first metal wiring film vertically in the above-described second embodiment, the same effect as this embodiment can be implemented even if the residue of the second metal wiring film is left so as not to intersect with the residue of the first metal wiring film.

As described above, since the first metal wiring film is etched away such that the residue of the first metal wiring film may be left so as to cover the step portion of the first interlayer insulating film along this step portion in the scribe line portion, the adhesion between the residue of the metal wiring film and the semiconductor substrate becomes strong and the residue of the first metal wiring film is prevented from coming off the step portion of the first interlayer insulating film and contaminating a wafer surface and the manufacturing facilities. As a result, the conventional disadvantage that a pattern defect was caused at the time of manufacturing the semiconductor integrated circuit device can be avoided.

In addition, when the residue of the second metal wiring film is formed so as not to intersect or overlap vertically with the residue of the first metal wiring film, the configuration of the step of the end portion of the scribe line portion is very gently-sloping. Therefore, since the resist is applied with approximately uniform thickness when the resist is applied thereto, the resolution of the resist and the etching precision are improved.

Although the present invention has been described and illustrated in detail, it is clearly understood that the same is by way of illustration and example only and is not to be taken by way of limitation, the spirit and scope of the present invention being limited only by the terms of the appended claims.

What is claimed is:

1. A method for manufacturing a semiconductor integrated circuit device comprising the steps of:

preparing a semiconductor substrate on which a scribe line portion is to be formed;

forming a first interlayer insulating film on said semiconductor substrate, said interlayer having an exposed surface;

etching away said first interlayer insulating film at said scribe line portion so as to expose the scribe line portion of said semiconductor substrate;

a step portion comprising an edge of said first interlayer insulating film being formed at said scribe line portion by etching said first interlayer insulating film;

forming a first metal wiring film on the whole surface of said semiconductor substrate comprising said exposed surface and said edge of said first interlayer insulating film after etching said first interlayer insulating film; and etching away said first metal wiring film; said step of etching said first interlayer metal wiring film being performed such that a portion of residue of said first metal wiring film may be left so as to cover the edge and an adjoining portion of the exposed surface of said first interlayer insulating film along the step portion in said scribe line portion.

2. A method for manufacturing a semiconductor integrated circuit device in accordance with claim 1 further comprising the steps of:

forming a second interlayer insulating film on the surface of said semiconductor substrate comprising the residue of said first metal wiring film after etching said first metal wiring film, said second interlayer having an exposed surface;

etching away said second interlayer insulating film of said scribe line portion so as to expose the scribe line portion of said semiconductor substrate;

a step portion comprising an edge of said second interlayer insulating film being formed at said scribe line portion by etching said second interlayer insulating film;

forming a second metal wiring film on the whole surface of said semiconductor substrate comprising said exposed surface and said step portion of said second interlayer insulating film after etching said second interlayer insulating film; and etching away said second metal wiring film; said step of etching said second metal wiring film being performed such that the residue of said second metal wiring film may be left so as to cover the edge and an adjoining portion of the exposed surface of said second interlayer without overlying vertically the residue of said first metal wiring film and so as to cover the edge and an adjoining portion of the exposed surface of said second interlayer insulating film along the step portion in said scribe line portion.

3. A method for manufacturing a semiconductor integrated circuit device in accordance with claim 2 further comprising the steps of:

forming a third interlayer insulating film on the whole surface of said semiconductor substrate comprising the residue of said second metal wiring film after etching said second metal wiring film, said third interlayer having an exposed surface;

etching away said third interlayer insulating film of said scribe line portion so as to expose the scribe line portion of said semiconductor substrate;

a step portion comprising an edge of said third interlayer insulating film being formed at said scribe line portion by etching said third interlayer insulating film;

forming a third metal wiring film on the whole surface of said semiconductor substrate comprising the exposed surface and said edge of said third interlayer insulating film after etching said third interlayer insulating film;

etching away said third metal wiring film; said step of etching said third metal wiring film being performed such that a portion of residue of said third metal wiring film may be left so as not to intersect nor overlap vertically with the residue of said second metal wiring film and so as to cover the edge and an adjoining portion of the exposed surface of said third interlayer insulating film along the step portion in said scribe line portion.

4. A method for manufacturing a semiconductor integrated circuit device in accordance with claim 1 further comprising the steps of:

forming a second interlayer insulating film on the whole surface of said semiconductor substrate comprising the residue of said first metal wiring film after etching said first metal wiring film said second interlayer having an exposed surface;

etching away said second interlayer insulating film of said scribe line portion so as to expose the scribe line portion of said semiconductor substrate;

a step portion comprising an edge of said second interlayer insulating film being formed at said scribe line portion by etching said second interlayer insulating film;

forming a second metal wiring film on the whole surface of said semiconductor substrate comprising said exposed surface and said step portion of said second interlayer insulating film after etching said second interlayer insulating film; and etching away said second metal wiring film; said step of etching said second metal wiring film being performed such that a portion of residue of said second metal wiring film may be left so as to intersect or overlap vertically with the residue of said first metal wiring film and so as to cover the step portion of said second interlayer insulating film along this step portion.

5. A method for manufacturing a semiconductor integrated circuit device in accordance with claim 4 further comprising the steps of:

forming a third interlayer insulating film on the whole surface of said semiconductor substrate comprising the residue of said second metal wiring film after etching said second metal wiring, said third interlayer having an exposed surface;

etching away said third interlayer insulating film of said scribe line portion so as to expose the scribe line portion of said semiconductor substrate;

a step portion comprising an edge of said third interlayer insulating film being formed at said scribe line portion by etching said third interlayer insulating film;

forming a third metal wiring film on the whole surface of said semiconductor substrate comprising said exposed surface and said step portion of said third interlayer insulating film after etching said third interlayer insulating film; and etching away said third metal wiring film; said step of etching said third metal wiring film being performed such that a portion of residue of said third metal wiring film may be left so as to intersect or overlap vertically with the residue of said first metal wiring film and so as to cover the step portion of said second interlayer insulating film along this step portion.

6. A method for manufacturing a semiconductor integrated circuit device in accordance with claim 1, wherein said semiconductor substrate comprises an external electrode provided in the vicinity of said scribe line portion.

7. A method for manufacturing a semiconductor integrated circuit device in accordance with claim 1, wherein said etching process of the metal wiring film is performed by anisotropic etching.

8. A method for manufacturing a semiconductor integrated circuit device in accordance with claim 7, wherein said anisotropic etching comprises reactive ion etching.

9. A method for manufacturing a semiconductor integrated circuit device in accordance with claim 1, wherein said semiconductor substrate comprising a silicon substrate.

* * * * *